Sept. 17, 1963 J. J. B. LAIR 3,104,360

PULSE AMPLITUDE MODULATED TO PULSE POSITION MODULATED CONVERTER

Filed April 12, 1955

INVENTOR
JULIEN J. B. LAIR
BY Alfred C. Hill
AGENT

1

3,104,360
PULSE AMPLITUDE MODULATED TO PULSE POSITION MODULATED CONVERTER

Julien J. B. Lair, Glen Ridge, N.J., assignor to International Telephone and Telegraph Corporation, Nutley, N.J., a corporation of Maryland Filed Apr. 12, 1955, Ser. No. 500,741
9 Claims. (Cl. 332—1)

Figure 1:
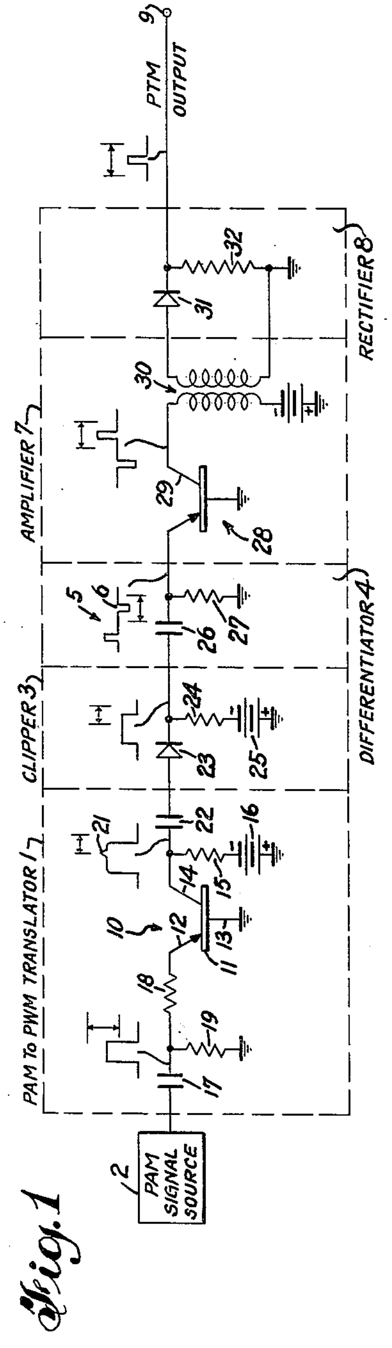

This invention relates to electrical signal translating systems, and more particularly to a signal translator for converting pulse signals modulated by the variation of one characteristic thereof to pulse signals modulated by varying other characteristics thereof employing therein semiconductor devices to effect the desired conversion.

There are various communication methods employing electrical pulses which are known to the art. In some cases these pulses may be fixed in time, but will have their amplitude characteristic varied in accordance with the instantaneous value of the modulating signal. In other cases the amplitude characteristic of the pulse has no bearing on the intelligence, the latter being conveyed by means of shifting the pulses with respect to a time base. Still another method of pulse communication conveys the instantaneous intelligence information by means of varying the pulse duration.

In certain situations, it has been found in the past to be advantageous to employ each of the above methods of pulse modulation in certain portions of a single communication system to utilize to the fullest extent the advantages of each of the pulse modulation methods. In such systems it is necessary to provide means to translate from one pulse modulation method to another of the pulse modulation methods without loss of intelligence.

Therefore, it is an object of this invention to provide an improved means to translate pulse signals modulated by variations of one characteristic thereof to pulse signals modulated by varying another characteristic thereof.

Another object of this invention is to provide a pulse signal translator for converting PAM (pulse amplitude modulation) signals to PWM (pulse width modulation) signals.

Still another object of this invention is to provide a pulse signal translator for converting PAM signals to PTM (pulse time modulation) signals including means to first translate the PAM signals to a PWM signal which in turn is operated upon to obtain the PTM signal.

A feature of this invention is the provision of a semiconductor device, commonly referred to as a transistor, to effect the translation from PAM signals to PWM signals.

Another feature of this invention is the provision of a pulse signal translator for converting PAM signals to PTM signals including a semiconductor device, commonly referred to as a transistor, to convert PAM signals to PWM signals and the combination of a differentiating circuit and a rectifier circuit to convert the PWM signals to PTM signals.

Still another feature of this invention is the provision of a transistor including a semiconducting body and at least three electrodes, commonly referred to as the base electrode, the emitter electrode and the collector electrode, in contact with said body and an external circuit network interconnecting said electrodes including means to bias said transistor at input saturation which results in an output pulse signal varying in pulse duration in accordance with the amplitude of the input signal due to the transistor memory or carrier storage phenomenon.

The above-mentioned and other features and objects of this invention will become more apparent by reference to the following description taken in conjunction with the accompanying drawing, in which:

FIG. 1 illustrates a schematic diagram of the electrical signal translator of this invention; and

2

Figure 2:
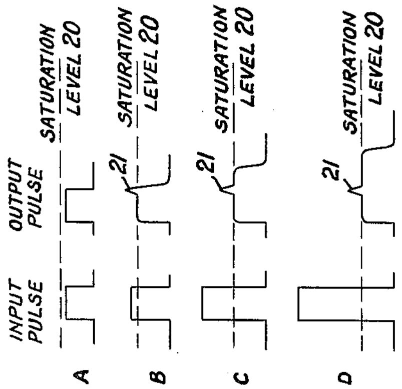

FIG. 2 illustrates a series of input and output waveforms useful in explaining the operation of the circuit of FIG. 1.

Referring to FIG. 1, there is illustrated therein an electrical signal translator in schematic diagram form of one embodiment of this invention. Basically the circuit includes a translator 1 employed to translate the PAM signal of source 2 to a PWM signal whose pulse duration is proportional to the amplitude variations of the PAM signal. The output of translator 1 is clipped by clipper 3 to remove disturbances in the vicinity of the peak of the output signal of translator 1. The clipped signal is then differentiated by differentiator circuit 4 to obtain relatively narrower pulses indicative of the leading and trailing edges of the output of clipper 3, the narrow pulse indicative of the trailing edge of clipper 3 carrying therewith the width variations of the PWM signal. As illustrated in curve 5, the pulse 6, indicative of the trailing edge of the width modulator pulse, has a negative polarity which normally should be inverted to become useful as a PTM signal and should be separated from the positive polarity pulse produced by the leading edge of the width modulator signal. The inversion of curve 5 is accomplished in an amplifier 7, the output of which is rectified by rectifier 8, for elimination of the now negative representation of the leading edge of the width modulator signal. The output of rectifier 8 is coupled to output terminal 9 and consists of a pulse signal whose time position is varied in accordance with the amplitude variations of the PAM signal of source 2.

In accordance with the principles of this invention translator 1 comprises a semiconductor device or transistor 10 including a semi-conducting portion or body 11, an electrode 13, commonly referred to as the base electrode, an input electrode 12, commonly referred to as the emitter electrode, and an output electrode 14, commonly referred to as the collector electrode. The base electrode 13 is connected directly to a reference point illustrated herein to be ground. The collector electrode 14 has coupled thereto a load resistance 15 and a negative voltage source 16, illustrated as a battery in series between ground and collector 14. The voltage source 16 is poled to apply a negative voltage through resistance 15 to collector 14 to establish a given amplitude level at which an input signal will cause the semiconductor device to saturation. The signal of source 2 is coupled through condenser 17 and a voltage dividing arrangement including resistances 18 and 19 to the emitter electrode 12.

It is well known in the transistor art that an input pulse applied to the input thereof below a given saturation level 20 will reproduce at the collector electrode an output pulse having substantially the same duration as the input pulse. Curve A of FIG. 2 illustrates this latter situation. It has been discovered that if the input pulse is increased above a saturation level 20, as illustrated in curve B of FIG. 2, the output pulse will increase only to the saturation level for the initial portion of this output pulse and will exhibit an increased amplitude just prior to the trailing edge of the input pulse, as indicated by pip 21. If the amplitude of the input pulse is increased still further above the saturation level 20, the pip 21 again appears at a time equivalent to the trailing edge of the input pulse. However, the voltage at the collector after pip 21 returns to the saturation level 20 and remains there for a duration depending upon the excess of saturating voltage present in the input pulse. A further increase in input amplitude will result in a longer duration pulse at the collector electrode. These latter situations are illustrated graphically in curves C and D of FIG. 2.

The pulse width variation at the collector electrode can be explained by the phenomenon referred to as a minority carrier storage, either "hole" storage or electron storage depending upon whether the transistor is of the junction or point contact type. The observed slow collector voltage change, or recovery time, of the transistor depends upon the recovery time of the collector as well as the recovery time of the emitter. The voltage across the collector barrier is relatively small but cannot be changed until the carrier storage mechanisms are removed from the body of the semiconducting material. It has been determined that the time for this change to take place is proportional to the amplitude of the input signal above the input saturation point, the larger the input above this point results in a greater carrier storage and thus an excess of carrier storage elements to be removed from the body of the semiconducting material.

In accordance with the principles of this invention, the voltage source 16 establishes a given saturation level above which the input signal will saturate the transistor device and thereby bring about the phenomenon described above. To facilitate the usefulness of this PAM to PWM translator it is necessary to maintain the amplitude of the PAM signal above a given minimum amplitude at least equal to the transistor input saturation level.

In a successful reduction to practice of the translator 1, I employed a possible combination of component values as presented hereinbelow. It is to be understood, however, that these values are not the only values of components which can be employed in the circuitry associated with transistor 10 and are presented here only by way of example.

| | | |
|---|---|---|
| Resistor **19** | ohms | 100,000 |
| Resistor **18** | do | 68 |
| Resistor **15** | do | 2,700 |
| Voltage source **16** | volts | —45 |

The PWM signal output of translator 1 is coupled via condenser 22 to clipper 3 which includes as components thereof diode 23 in series with the output of translator 1 and a series circuit including resistor 24 and voltage source 25 disposed in a shunt relation to the signal output of translator 1. The diode 23 may be of the vacuum type or semiconducting type as the situation dictates. The value of resistor 24 and voltage source 25 is so adjusted as to clip the translator output signal for removal of pip 21 and the maintenance of a substantially constant amplitude, pulse width signal.

The output signal of clipper 3 is coupled to condenser 26, disposed in serial relation thereto, and resistor 27, disposed in a shunt relation thereto for differentiation of the pulse width modulated signal to derive relatively narrow pips indicative of the leading and trailing edges thereof. In this manner, there is obtained a negative polarity pulse position modulated in accordance with the width modulation of the output of translator 1 and hence the amplitude modulation of the source 2. The resultant differentiated signal is inverted in polarity by means of a transistor amplifier 28, the operation of which is known in the art. The inverted signal is coupled from collector 29 of transistor amplifier 28 through coupling transformer 30 to rectifier 8. Rectifier 8 includes as the active portion thereof diode 31, of the vacuum or semiconductor type, for passage of only the positive portion of the output of amplifier 7, the PTM signal. This signal is coupled from load resistor 32 to the output terminal 9 for utilization in further circuitry.

While I have described the principles of my invention in connection with specific apparatus, it is to be clearly understood that this description is made only by way of example and not as a limitation to the scope of my invention as set forth in the objects thereof and in the accompanying claims.

I claim:

1. An electrical signal translating system comprising a source of amplitude modulated pulse signals in which the pulses of minimum amplitude are at least equal to a given amplitude, a semiconductor device including a semiconducting portion and an input electrode, an output electrode and at least one other electrode in contact with said portion, circuit means interconnecting said electrodes including means to bias said device to establish an input saturation level therefor equal to said given amplitude, a first resistor and a second resistor in serial order to couple said input electrode to a reference potential, means to couple the signals of said source to the junction of said first and second resistors, and means coupled to said output electrode to remove from said semiconductor device pulse signals having a duration varying in proportion to the amplitude variation of the signals of said source above said given amplitude.

2. An electrical signal translating system comprising a source of amplitude modulated pulse signals in which the pulses of minimum amplitude are at least equal to a given amplitude, a transistor device including a semiconducting body, a base electrode, an emitter electrode and a collector electrode in contact with said body, an external circuit network interconnecting said electrodes including means to bias said device to establish an input saturation level therefor equal to said given amplitude, a first resistor and a second resistor in serial order to couple said emitter electrode to a reference potential, means to couple the signals of said source to the junction of said first and second resistors, and means coupled to said collector electrode to remove from said device pulse signals having a duration varying in proportion to the amplitude variation of the signals of said source above said given amplitude.

3. An electrical signal translating system comprising a source of positive amplitude modulated pulse signals in which the pulses of minimum amplitude are at least equal to a given positive amplitude, a transistor device including a semiconducting body, a base electrode, an emitter electrode and a collector electrode in contact with said body, an external circuit network interconnecting said electrodes including a negative voltage source coupled to said collector electrode to bias said device to establish an input saturation level therefor equal to said given amplitude, a first resistor and a second resistor in serial order to couple said emitter electrode to a reference potential, means to couple the signals of said source to the junction of said first and second resistors, and means coupled to said collector electrode to remove from said device positive pulse signals having a duration varying in proportion to the amplitude variation of the signal of said source above said given amplitude.

4. An electrical signal translating system comprising a source of positive amplitude modulated pulse signals in which the pulses of minimum amplitude are at least equal to a given positive amplitude, a transistor device including a semiconducting body, a base electrode, an emitter electrode and a collector electrode in contact with said body, an external circuit network interconnecting said electrodes including a negative voltage source and resistance in serial order coupled to said collector electrode, the voltage of said negative voltage source biasing said device to establish an input saturation level therefor equal to said given amplitude, a first resistor and a second resistor in serial order to couple said emitter electrode to a reference potential, means to couple the signals of said source to the junction of said first and second resistors to provide an excess of carrier storage elements within said body, the excess of said storage elements varying in proportion to the amplitude of the signal of said source above said given amplitude, and means coupled to the junction of said resistance and said collector electrode to remove from said device positive pulse signals having trailing edges whose time of occurrence is proportional to the time for removal of the variable amount of the excess of said storage elements from said body.

5. An electrical signal translating system comprising a source of amplitude modulated pulse signals in which the pulses of minimum amplitude are at least equal to a given amplitude, a transistor device including a semiconducting body, a base electrode, an emitter electrode and a collector electrode in contact with said body, conductor means to couple said base electrode to a reference potential, a first resistor and a second resistor in serial order to couple said emitter electrode to said reference potential, a third resistor and a negative voltage source in serial order to couple said collector electrode to said reference potential, said negative voltage source biasing said device to establish an input saturation level therefor equal to said given amplitude, capacitive means to couple the signal of said source to the junction of said first and second resistors, and capacitive means coupled to the junction of said collector electrode and said third resistor to remove from said device pulse signals varying in duration in accordance with the amplitude variation above said given amplitude of the signals of said source.

6. An electrical signal translating system comprising a source of amplitude modulated pulse signals in which the pulses of minimum amplitude are at least equal to a given amplitude, a semiconductor device including a semiconducting portion and an input electrode, an output electrode and at least one other electrode in contact with said portion, circuit means interconnecting said electrodes including means to bias said device to establish an input saturation level therefor equal to said given amplitude, means coupling the signals of said source to said input electrode, a capacitive means coupled to said output electrode to remove from said semiconductor device pulse signals varying in duration in accordance with the amplitude variation above said given amplitude of the signals of said source, signal limiting means coupled to said capacitive means to eliminate the peak portion of the output pulse signals of said device, differentiating means coupled to said limiting means to produce pulses indicative of the time position of the leading and trailing edges of the duration varying pulse signals, the resulting trailing edge pulse varying in time position in accordance with the duration of the output of said device, means coupled to said signal limiting means to eliminate the pulse indicative of the time position of the leading edge of the duration varying pulse signals, and terminal means coupled to said means to eliminate for removing from said translating system the time position varying pulse.

7. An electrical signal translating system comprising a source of amplitude modulated pulse signals in which the pulses of minimum amplitude are at least equal to a given amplitude, a semiconductor device including a semiconducting portion and an input electrode, an output electrode and at least one other electrode in contact with said portion, circuit means interconnecting said electrodes including means to bias said device to establish an input saturation level therefor equal to said given amplitude, means coupling the signals of said source to said input electrode, a capacitive means coupled to said output electrode to remove from said semiconductor device pulse signals varying in duration in accordance with the amplitude variation above said given amplitude of the signals of said source, signal limiting means coupled to said capacitive means to eliminate the peak portion of the output pulse signals of said device, differentiating means coupled to said limiting means to produce pulses indicative of the time position of the leading and trailing edges of the duration varying pulse signals, the resulting trailing edge pulse varying in time position in accordance with the duration of the output of said device, means coupled to the output of said differentiating means to invert the polarity of the output signal therefrom, means coupled to said means to invert to eliminate the pulse indicative of the time position of the leading edge of the duration varying pulse signals, and terminal means coupled to said means to eliminate for removing from said translating system the time position varying pulse.

8. An electrical signal translating system comprising a source of amplitude modulated pulse signals in which the pulses of minimum amplitude are at least equal to a given amplitude, a transistor device including a semiconducting body, a base electrode, an emitter electrode and a collector electrode in contact with said body, conductor means to couple said base electrode to a reference potential, a first resistor and a second resistor in serial order to couple said emitter electrode to said reference potential, a third resistor and a negative voltage source in serial order to couple said collector electrode to said reference potential, said negative voltage source biasing said device to establish an input saturation level therefor equal to said given amplitude, capacitive means to couple the signal of said source to the junction of said first and second resistors, and capacitive means coupled to the junction of said collector electrode and said third resistor to remove from said device pulse signals varying in duration in accordance with the amplitude variation above said given amplitude of the signals of said source, a diode type device having one electrode thereof coupled to said capacitive means and a series circuit including a resistance and a negative voltage source coupled between the other electrode of said diode type device and said reference potential, said diode type device and said series circuit limiting the amplitude of the width modulated output signal of said capacitive means to a value less than the peak value thereof, a capacitor have one plate thereof coupled to the junction of said series circuit and said diode type device and a resistor coupled between the other plate of said capacitor and said reference potential, said capacitor and said resistor differentiating the amplitude limited, width modulated output signals to derive pulses indicative of the leading edge of said width modulated signals and time modulated pulses indicative of the variation of the trailing edge of said width modulated signals, a transistor amplifier to invert the differentiated signals including a semiconducting body, a base electrode, an emitter electrode and a collector electrode in contact with said body, conductor means coupling said base electrode to said reference potential, conductor means coupling said emitter electrode to the junction of said capacitor and said resistor and an output means coupled between said collector electrode and said reference potential including the primary winding of an output transformer and a negative voltage source in a series relation, the secondary winding of said output transformer coupling the output of said transistor amplifier to a rectifier circuit including the series circuit of a diode type rectifier and resistor in shunt relation to said secondary winding to provide passage therethrough of only said time modulated pulses, and means coupled to the junction of said diode type rectifier and resistor to remove from said rectifier circuit said time modulated pulses.

9. An electrical signal translating system comprising a source of amplitude modulated pulse signals of given polarity in which the pulses of minimum amplitude are at least equal to a given amplitude of said given polarity, a semiconductor device including a semiconducting portion and an input electrode, an output electrode and at least one other electrode in contact with said portion, circuit means interconnecting said electrodes including means to bias said device to establish an input saturation level therefor equal to said given amplitude, a first resistor and a second resistor in serial order to couple said input electrode to a reference potential, means to couple the signals of said source to the junction of said first and second resistors, means coupled to said output electrode to remove from said semiconductor device pulse signals of said given polarity having a duration varying in proportion to the amplitude variation of the signals of said source above said given amplitude, and signal limiting means responsive to the duration varying pulse signal at said output electrode to eliminate the peak portion thereof of said given polarity.

References Cited in the file of this patent

UNITED STATES PATENTS

| | | |
|---|---|---|
| 2,113,214 | Luck | Apr. 5, 1938 |
| 2,435,496 | Guanella | Feb. 3, 1948 |
| 2,567,203 | Golay | Sept. 11, 1951 |
| 2,627,039 | MacWilliams | Jan. 27, 1953 |
| 2,725,317 | Kleimack | Nov. 29, 1955 |
| 2,905,815 | Goodrich | Sept. 22, 1959 |

OTHER REFERENCES

Publication I, Some Transient Properties of Transistors by Bassett et al., British Journal of Applied Physics, pages 116, 117, April 1953.